United States Patent [19]

Sherman

[11] Patent Number: 5,239,493
[45] Date of Patent: Aug. 24, 1993

[54] METHOD AND APPARATUS FOR INTERPRETING AND ORGANIZING TIMING SPECIFICATION INFORMATION

[75] Inventor: Steven K. Sherman, Marlboro, Mass.

[73] Assignee: Digital Equipment Corporation, Maynard, Mass.

[21] Appl. No.: 544,269

[22] Filed: Jun. 26, 1990

[51] Int. Cl.⁵ .............................................. G06F 15/60
[52] U.S. Cl. ..................................... 364/578; 364/488
[58] Field of Search ............... 364/578, 200, 900, 419, 364/488, 513; 371/23

[56] References Cited

U.S. PATENT DOCUMENTS

| | | | |
|---|---|---|---|
| 4,490,811 | 12/1984 | Yianilos et al. | 364/900 |
| 4,821,220 | 4/1989 | Duisberg | 364/578 |
| 4,914,590 | 4/1990 | Loatman et al. | 364/200 |
| 4,965,758 | 10/1990 | Sherman | 364/578 |

OTHER PUBLICATIONS

JEDEC Standard No. 100, JEDEC Solid State Products Engineering Council, Oct. 1982.
McWilliams, T. M., Verification of timing constraints on large digital systems, Ph.D. Thesis, May 1980.
Kara, A. and Rastogi, R. and Kawamura, K., *Automate Timing Design,* IEEE Design & Test of Computers, 1988.
Alali and Landrault, *Simflo: A Symbolic Simulator for Timing Constraints Verification,* Proc. of IASTED Int'l Symposium, on Modeling and Simulation 168, 1985.
Camposano and Kunz;mann, "*Considering Timing Constraints in Synthesis From a Behavioural Description*", Proc. of IEEE Int'l Conference on Computer Design 6, 1986.
Dasarathy, "Timing Constraints of Real-Time Systems: Constructs for Expressing Them, Methods of Validating Them", SE-11 *IEEE Transactions on Software Engineering* 80, 1985.
Bartlett, Cohen, DeGeus and Hachtel, "Synthesis and Optimization of Multi-Level Logic Under Timing Constraints", *Proc. of IEEE Int'l Conference on Computer Design* 290, 1985.
Sherman, "Algorithms for Timing Requirement Analysis and Generation" *Proc of 25th ACM Design Automation Conference* 724, 1988.
Cobourn, *An Evaluation of Cleopatra, A Natural Language Interface for CAD,* (Carnegi-Mellon University Research Report No. CMUCAD-87-1), Jan. 1987.
Borgida, "*Knowledge Representation as the Basis for Requirements Specifications*", IEEE Computer, Apr. 1985, at 82.
Bonnet, *Schema-Shift Strategies to Understanding Texts in Natural Language,* Stanford University Report. No. STAN-CS-79-759, Aug. 1979.
Dyer and Zernik, "Parsing Paradigms and Language Learning", *Proc. of First Annual Artificial Intelligence & Advanced Computer Technology Conference* 259, 1985.
Excerpts from Sowa, *Conceptual Structures: Information Processing in Mind and Machine,* Addison Wesley Publishing Co., 1984.

Primary Examiner—Parshotam S. Lall
Assistant Examiner—Michael Zanelli
Attorney, Agent, or Firm—Cesari and McKenna

[57] ABSTRACT

A method and apparatus for converting unstructured descriptions of signal timing constraints, which can be entered by a user in a natural-language format, into unambiguous symbolic specification descriptions. The invention also generates file structures containing both the signal characteristics entered by the user and timing-constraint information that may be derived therefrom.

16 Claims, 2 Drawing Sheets

METHOD AND APPARATUS FOR INTERPRETING AND ORGANIZING TIMING SPECIFICATION INFORMATION

I. BACKGROUND OF THE INVENTION

A. Field of the Invention

The present invention relates to electronic design, and more particularly to analysis of signal timing requirements in complex electronic systems.

B. Description of the Prior Art

Digital processing systems typically consist of a combinational logic network and bistable latch elements. The combinational logic network contains a large number of logic components that perform decision-making functions, while the latches serve as memory elements to temporarily store input, intermediate and output data, as well as control information. A clocking system mediates communication among the system components and state changes in the individual elements; usually, the state of the system changes at the occurrence of each clock pulse.

Components and groups of components have timing requirements that derive from specific operational features. Some requirements arise from hardware limitations; for example, a component may require establishment of a stable input signal for a certain minimum time interval before a stable output signal from that component can be achieved. Other requirements arise from system features such as bus characteristics, interface protocols or cycle times. Given the large number of interrelated timing requirements likely to be encountered in the design of even modest digital systems, methods of identifying and resolving timing conflicts are critical.

Two such methods are described in copending application Ser. No. 162,624 (commonly owned with the present application and hereby incorporated by reference), which describes identification of an optimized, reduced set of consistent timing requirements that deviates minimally from the set originally proposed by the user; and copending application Ser. No. 205,811 (commonly owned with the present application and hereby incorporated by reference), which describes prioritization of timing requirements. See also Sherman, *Algorithms for Timing Requirement Analysis and Generation,* Proc. of 25th ACM/IEEE Design Automation Conf. at 724 (1988).

One difficulty attending the use of such methods is presentation of th timing requirements of the various elements in a consistent format. Numerous ways of describing timing information currently exist, and engineers often find it difficult and tedious to accurately express this information in the manner most convenient for the timing resolution method. Ambiguities and errors are often introduced. Indeed, engineers collaborating on a project may have trouble communicating among themselves about timing-constraint issues. However, if such issues remain unaddressed until software simulation or construction of a prototype, expensive late-stage redesign work may become necessary.

A second issue relating to timing-constraint nomenclature involves computer-implemented design-assistance packages. These programs generally require not only a consistent terminology for specification information, but one that is also amenable to straightforward computer analysis. Ideally, information should be provided in a form that is terse and easily interpreted.

C. Objects of the Invention

Accordingly, it is an object of the present invention to provide a method of reducing an unstructured specification description to a consistent format.

It is another object of the invention to enable design engineers to enter specification information in a natural-language format.

It is a further object of the invention to provide symbolic specification descriptions that are easily interpreted by a computer.

It is yet another object of the invention to produce specification descriptions that are as free from ambiguity as the entered information permits.

D. Definitions

As used herein, the following terms have the meanings indicated opposite and with reference to FIG. 1:

State—Represents the condition of a node in an electrical system.

Non-Transition State—In the timing diagram depicted in FIG. 1, non-transition states are designated by reference numerals 20, 22, 24, 26 and 28. A non-transition state can be logic level zero (states 20, 24 and 26), logic level 1 (states 22, 28), stable or high impedance.

Transition State—Represents the boundary between sequential non-transition states in a signal. In FIG. 1, transition states are designated by reference numerals 30, 32 and 34. A transition state can be rise (zero-to-one transition states 30 and 34), fall (one-to-zero transition states 32), rise-fall or change. "Rise-fall" denotes an indeterminate transition state between two non-transition states and can include zero-to-one, one-to-zero and no-change. "Change" is similar to rise-fall but can also include transition to a high impedance state.

Transition—Represents a boundary between states. Transitions are denoted collectively in FIG. 1 by reference numeral 38.

Signal—Denotes a named sequence of states, e.g., signals A and B in FIG. 1.

Timestamp—Denotes an absolute time value signifying when a transition will occur. Timestamps are denoted as $t_1$ through $t_6$ in FIG. 1.

Pattern—Denotes a set of signals with timestamps.

Dependence—Denotes a minimum or maximum time between transitions on the same or different specified signals (i.e., a timing constraint), and the importance of the constraint. For example, it may be necessary for the interval between $t_4$ and $t_5$ to assume or exceed a minimum critical value to permit reliable capture of signal data.

Specification—Describes timing relationships among signals with less specificity than that found in a dependence.

Dependence Connection—Establishes the transitions on a pattern or patterns to which a particular dependence relates.

II. DESCRIPTION OF THE INVENTION

A. Brief Summary of the Invention

The present invention allows a user to enter timing information in a familiar, natural-language format. The invention will extract critical specification parameters, and create specification data files based on a standard nomenclature and format. In the preferred embodiment, the nomenclature is based on the JEDEC 100 Standard (published by Electronic Industries Association, Washington, D.C., and hereby incorporated by reference), but other forms of specification expression could easily be substituted.

Furthermore, specification information frequently contains implied dependence/pattern information. The invention creates data files containing this information to the extent that it can be inferred from the user's specifications.

Natural-language processing refers generally to conversion of natural-language expressions into a more fundamental structure that represents meaning. Although numerous theoretical approaches to natural-language processing have been proposed and to varying extents implemented, success often depends on the ability to circumscribe the field of application. In the present invention, the field is highly specific and therefore amenable to reliable interpretive processing. Furthermore, the structured nature of the information provides a straightforward basis for translation of virtually any relevant input into a standard format.

The invention uses a "lexicon" technique of natural-language analysis to interpret the user's description of timing requirements. In so doing, the invention decomposes this description into specification and dependence information (which relate to timing constraints) and pattern information (which describes timestamp characteristics of the respective signals). Although disparate in their respective meaning and content, these different types of information are usually conflated by engineers. A key advantage of the present invention is the ability to separate and focus on essential timing-constraint data, which presents the chief obstacle to a self-consistent and compatible design; this information can be analyzed and manipulated manually, or using a system such as that described in the '624 and '811 patent applications.

B. Brief Description of the Drawings

The foregoing discussion will be understood more readily from the following detailed description of the invention, when taken in conjunction with the accompanying drawings, in which.

C. Detailed Description of the Invention

The invention comprises a method and apparatus for establishing specification and dependence information based on a user's description of timing constraints. The invention defines a "specification" as consisting of the following data:

Specification Description: Provided by the user, this basic timing-constraint information can be entered in a natural-language format. Specification criteria may be derived from product literature or predetermined design criteria.

Specification Name: After analyzing the description, the invention generates a name representative of the description in accordance with an established standard; in the preferred embodiment, this is the JEDEC 100 standard.

Min. Expression (optional): Minimum time between transitions.

Max. Expression (optional): Maximum time between transitions.

Typ. Expression (optional): Typical time between transitions.

Notes (optional): user comments

Each specification is an ordered arrangement of this information, wherein a value or character string representative of each of the above data is entered into a field associated with a particular dependence. A specification file is a set of specifications.

The user is expected to enter a min. or max. expression. This information can be entered in a natural-language format and parsed, but I have found it preferable to limit the complex task of parsing to the specification description. Accordingly, in the preferred embodiment, min./max. information is obtained by prompting the user to enter the information in response to a specific query.

The user enters information relating to characteristics of specifications by indicating relationships among signals. For example, the user might specify the timing constraint $t_4-t_6$ in FIG. 1 as "Setup time, B high to clock A low". In response to a prompt, the user might indicate a min. expression of 10 ns. This information set specifies the signals involved (A and B), the type of timing constraint (setup time), the fact that signal A is a clock signal, that signal B is at logic level 1 at the beginning of the specification, that signal A is at logic level 0 at the end of the specification, and the min. expression (10 ns).

In the present invention, a specification database is an ordered arrangement of information relating to signal values surrounding a specification. A specification database consists of the following categories of information:

From Signal: The name of the first signal to occur in the specification (in the above example, this would be B). The fact that a signal occurs first within a specification does not mean that the user necessarily entered this signal at the beginning of his or her description. For example, the above example could be rewritten as "Setup time, clock A low after B high". In either case, B is considered the first signal within the specification.

To Signal: The name of the last signal to occur in a specification (in the above example, this would be A).

Figure 1:
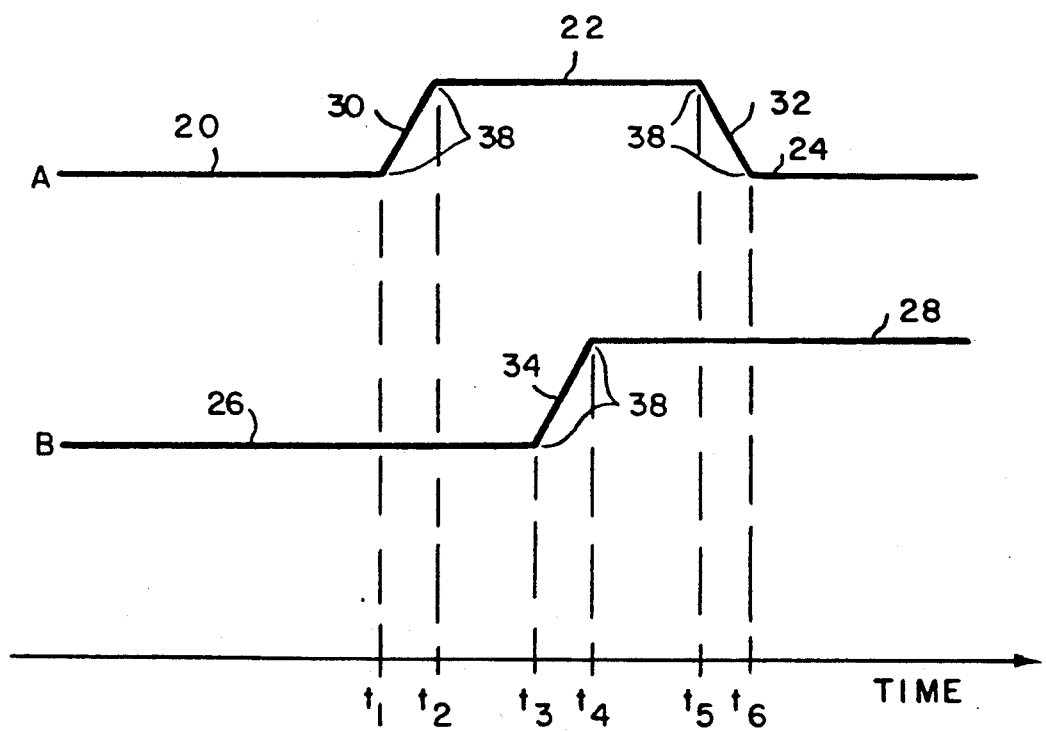
FIG. 1 depicts timing attributes of two sample signals.

From Prev: The state previous to a transition in a "from" signal. In FIG. 1, the state previous to B=high logic level is B=low logic level; however, this cannot be inferred from the information furnished by the user in the above example.

To Prev: The state previous to a transition in a "to" signal In FIG. 1, the state previous to A=low logic level is A= high logic level. Again, this cannot be inferred from the information furnished by the user in the above example.

From Current: the state following a transition in a "from" signal (in the above example, this would be B=high logic level).

To Current: The state following a transition in a "to" signal (in the above example, this would be A=low logic level).

Same Signal: True if the specification relates states within the same signal.

Diff. Signal: True if the specification relates states within different signals.

Type: Max or min.

Classification: As described below, the specification to which the dependence relates is assigned a timing classification in accordance with the JEDEC 100 Standard based on the user's specification description.

In operation, the invention enters data into as many of these categories as possible based on the entered specification description. The user is also free to provide this information directly. Certain dependence information can be derived from specification based on known characteristics of different signal types. In the above example, "setup time" implies (i) a "To Prev." state of risefall (i.e., the pre-transition state can take any value except high impedance), (ii) that the specification will always relate to states within different signals, and (iii) the necessity of a min. expression.

Other information implied by specification classifications is summarized in the following table, where "X" entries denote non-transition states other than high impedance (i.e., high, low or stable), "Z" entries denote high-impedance states, and "S" entries denote stable states:

TABLE I

| from prev | from current | to prev | to current | same signals | diff signals | type | user | classification declared |
|---|---|---|---|---|---|---|---|---|
| 0 | 1 | — | — | 1 | 0 | — | — | Rise |
| 1 | 0 | — | — | 1 | 0 | — | — | Fall |
| — | 0 or 1 | X | — | 1 | 0 | — | — | Cycle |
| X | X | X | X | 1 | 0 | — | 1 | Cycle (no valid signal) |
| Z | X | X | Z | 1 | 0 | — | — | Pulse Width |
| X | Z | Z | X | 1 | 0 | — | — | Pulse Width |
| S | S | S | S | 1 | 0 | — | — | Pulse Width |
| 0 | 1 | 1 | 0 | 1 | 0 | — | — | Pulse Width |
| 1 | 0 | 0 | 1 | 1 | 0 | — | — | Pulse Width |
| 0 | 1 | X | — | 0 | 1 | min | — | Hold |
| 1 | 0 | X | — | 0 | 1 | min | — | Hold |
| — | X | 0 | 1 | 0 | 1 | min | — | Setup |
| — | X | 1 | 0 | 0 | 1 | min | — | Setup |
| 0 | 1 | X | Z | 0 | 1 | — | — | Disable |
| 1 | 0 | X | Z | 0 | 1 | — | — | Disable |
| 0 | 1 | Z | X | 0 | 1 | — | — | Enable |
| 1 | 0 | Z | X | 0 | 1 | — | — | Enable |
| X | X | X | X | 0 | 1 | min | — | Valid |
| X | X | X | X | 0 | 1 | max | — | Access |
| X | X | — | X | 0 | 1 | min | 1 | Recovery |
| — | — | — | — | — | — | max | 1 | Refresh |
| — | — | — | 0 | 0 | 1 | min | 1 | Precharge |
| — | — | — | 1 | 0 | 1 | min | 1 | Precharge |
| — | — | X | X | 0 | 1 | — | — | Propagation |
| — | — | X | X | 0 | 1 | — | — | Propagation Delay |

The invention is most conveniently practiced using a digital computer with an appropriate interface, input-/output means, storage facility and processor unit for storing and manipulating information in accordance with the method of the present invention. With the description(s) in storage, the parser module of the invention extracts, at a minimum, the information necessary for a complete specification file; if this information is not found, an error message is returned as a prompt to the user.

Figure 2:
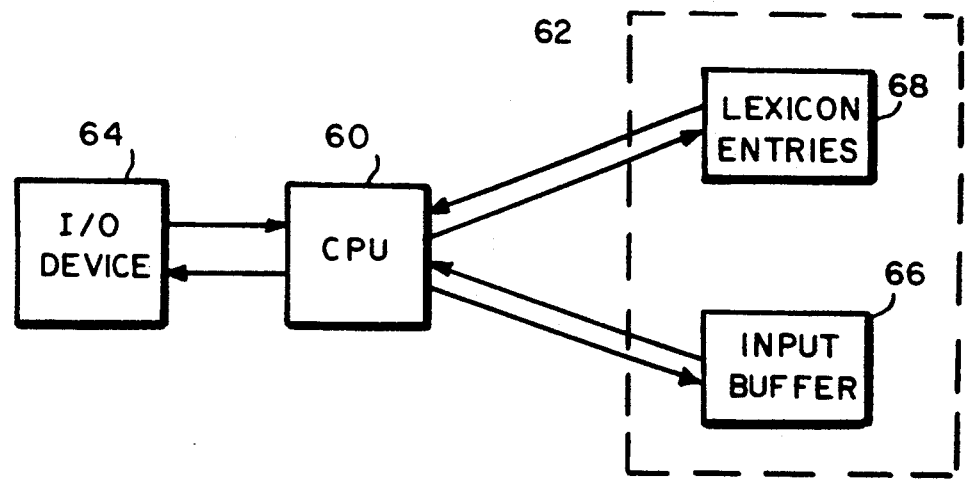
FIG. 2 is a schematic depiction of an apparatus suitable for carrying out the present invention.

Refer not to FIG. 2, which schematically illustrates the components of a suitable system. These components include a central-processing unit (CPU) 60, a system memory bank 62 with which CPU 60 communicates, and one or more input/output (I/O) devices 64 that facilitate interaction with a user. System memory 62 contains an input buffer 66, which provides memory locations for storing the user's entered descriptions, and a set of locations 68 for storing lexicon entries as hereinafter described.

Parsing is accomplished by treating the user's input as a character string, and using standard string-analysis routines to detect matches between sorted lexicon entries and the string. The syntax of the lexicon entries is:

STRING.CATEGORY;TYPE

STRING represents the character string used to search the input string for a match. In the preferred embodiment, STRING may be any string of characters, and may also include the following "wild-card" characters:

* = any string of non-space characters or no character
⁁ = any string of capitalized letters or underscore
# = any string of integers Lexicon STRING entries are sorted in order of increasing ambiguity. Each individual entry is sequentially compared, character by character, to the input string according to the sorted order, until a match is found. This procedure ensures derivation of as much information as possible from each STRING position, and production of the least ambiguous matches. In this context, "ambiguity" refers both to information content and the number of wildcard characters (which increase ambiguity).

I have found that integers provide less ambiguous information than capital letters, which themselves provide less ambiguous information than strings of mixed-case or lower-case letters. This finding is based on experience with the manner in which specifications tend to be expressed by engineers. Accordingly, lexicon entries are sorted according to a key that reflects these hierarchical relationships among character types, as well as the absolute number of wildcard characters necessary for a match. A preferred sort key is as follows:

x—absolute match to given characters
x#x—match to wildcard for integers within a specified range (does not include ⁁ or *)
x⁁x—match to wildcard for upper-case characters within specified guideline (does not include *)
x*x—match to wildcard for any string within specified guideline
—match to wildcard for any string of integers ^ —match to wildcard for any string of capitalized letters or underscore
*—any string of non-white characters or no character
A preferred lexicon appears in the following table:

TABLE 2

```
^ .signal;true.
-^ .signal;false.
~^ .signal;false.
^ L.signal;false.
^ #.signal;true.
-^ #.signal;false.
~^ #.signal;false.
^ #L.signal;false.
^ #.signal;true.
-^ #^ .signal;false.
~^ #^ .signal;false.
^ #^ L.signal.false.
^ <#>.signal;data.
-^ <#>.signal;data.
~^ <#>.signal;data.
^ <#:#>.signal;data.
-^ <#:#>.signal;data.
~^ <#:#>.signal;data.
^ #<#>.signal;data.
-^ #<#>.signal;data.
~^ #<#>.signal;data.
^ #<#:#>.signal;data.
-^ #<#:#>.signal;data.
~^ #<#:#>.signal;data.
low.state;0.
zero.state;0.
lo.state,0.
high.state;1.
one.state;1.
hi.state;1.
stable.state;S.
valid.state;S.
hi-impedance.state;Z.
high-impedance.state;Z.
hi impedance.stste;Z.
high-impedance.state;Z.
float*.state;Z.
X.state;dummy.
Y.state;dummy.
unknown.state;dummy.
dummy.state;dummy.
rise.state;R.
risen.state;R.
rises.state;R.
rising.state;R.
fall.state;F.
fallen.state;F.
falls.state;F.
falling.state;F.
chang*.state;C.
before.to;to.
result*.to;to.
caus*.to;to.
then.to;to.
through.to;to.
to.to;to.
until.to;to.
til.to;to.
>.to;to.
after.to;from.
from.to;from.
<.to;from.
access*.class;access.
cycle*.class;cycle.
period*.class;cycle.
delay*.class;delay.
disable*.class;disable.
enable*.class;enable.
fall*.class;fall.
hold*.class;hold.
held*.class;hold.
precharg*.class;precharge.
propagati*.class;propagation.
pulse*.class;pulse.
width*.class;pulse.
rise*.class;rise.
rising*.class;rise.
```

TABLE 2-continued

```
recover*.class;recovery.
refresh*.class;refresh.
set*up*.class;setup.
valid*.class;valid.
stabl*.class;valid.
clock*.is;clock.
cycl*.is;clock.
period*.is;clock.
assert*.is;asserted.
activ*.is;active.
inactiv*.is;inactive.
deactiv*.is;deasserted.
deassert*.is;deasserted.
```

In the foregoing example:
a. ~ and "-" are negation symbols, i.e. they indicate that assertion of a signal is the low level; and
b. < > indicate that the enclosed value indicates data, i.e. a line or range of lines carry data signals CATEGORY and TYPE represent the conclusions attending a successful STRING match. The CATEGORY specifies action to be taken, while the TYPE represents data relating thereto. All relevant specification information can be classified in the following five CATEGORIES:

1) Signal
   TYPES:
   True
   False
   Data
   Meaning: Indicates that a string represents a signal, and that the signal is asserted true or false, or that the signal is a data signal.
2) State
   TYPES:
   0
   1
   Stable
   High impedance
   Rise
   Fall
   Rise-Fall
   Change
   Dummy
   Meaning: Indicates that a string represents a state, with the TYPE denoting the particular state. A "dummy" state permits the user to specify a state without any information regarding its nature, other than difference from a previous state.
3) To
   TYPES:'To
   From
   Meaning: Indicates the precedence of the two signal sets stated (or implicit) in the input description.
4) Class
   TYPES:
   Access
   Cycle
   Delay
   Disable
   Enable
   Fall
   Hold
   Precharge
   Propagation
   Pulse
   Rise
   Recovery Refresh
Setup
Valid Meaning: These terms represent the timing requirements and signal characteristics set forth in JEDEC Standard 100, and serve as the specification classification. This information guides selection of a specification name, and also enables elucidation of specification information according to Table 1.

5) Is

TYPES:
Clock
Asserted
Active

Meaning: Indicates whether a signal is a clock and whether it is considered active or asserted in the description. This information further narrows the choice of name under JEDEC Standard 100.

The value of sorting the lexicon, which facilitates matching to the most definite entries first, lies both in reduction of the number of necessary lexicon entries and accommodation of heuristic inferences based on the wording of the entry. This can be illustrated with a simple example. Suppose the user provides the following specification: "Pulse width, AL low". This would result in a match to the lexicon entries ^L.signal;false and ^.siqnal;true. However, the low state designation in combination with the signal name "AL" suggests that the signal is asserted when false, or logic level 0. Because the ^L.signal;false entry precedes ^.signal;true in the lexicon, the invention will infer that the signal is asserted when false. This inference, which is more likely to be correct than incorrect, arises solely from the sorted nature of lexicon entries; it is unnecessary to further discriminate among entry matches, or add further entries to minimize the possibility of multiple matches.

It is possible that the designer of the lexicon might introduce conflicts in ambiguity among entries; that is, more than one entry might match with STRING and CATEGORY components but differ in TYPE components, resulting in unpredictable actions during parsing. For example, two such entries might be:

H^.signal;true

^ L.signal; false.

A problem becomes apparent if a signal "HL" within a specification description is parsed using these two entries. The two lexicon entries have the same level of ambiguity, making it unpredictable as to which will occur first after lexicon sorting. In turn, it becomes unpredictable as to whether signal "HL" will be parsed as a signal that is asserted true or false. Unless the lexicon designer is aware of this, a parsing limitation may be introduced.

Because parsing limitations are likely to arise in at least some situations similar to that described above regardless of the care with which the lexicon is designed, it is useful to be able to identify sources of conflicting ambiguity. This can be accomplished by making provisions so that each lexicon entry is used to parse the remaining entries. Each match that is detected between entries defines such a source, since each of the matched entries can correspond to a particular specification description. More specifically, conflicting ambiguity is identified where STRING and CATEGORY components of two entries match, but their TYPE components do not. This procedure will reveal conflicting ambiguity among the two entries discussed above.

The invention also provides for default designations in the event that a specification class is not detected. If one or no signals are identified during parsing, the system assigns a "pulse width" specification class to the specification. If two signals are identified, the system assigns a "delay time" specification class to the specification. These default values represent a "best guess" as to the class of specification intended by the user. In the preferred embodiment, the user is asked to verify the default value prior to its inclusion in the specification file.

It is also possible that the user's designated specification class will conflict with the accompanying descriptive information. This situation provides an additional mechanism for error-checking, and will occur, for example, when the user's timing information is not consistent with that set forth in Table 1 for the relevant specification class. In order to determine whether the user's designated classification should prevail over that which would be expected given the user's timing information, Table 1 contains a field denoted "User Declared". When set to 1, this field indicates that the user's designation should be respected; when not set, the invention assumes that the user has erroneously entered the classification (or used terminology inconsistent with JEDEC Standard 100). In the latter case, the user's classification is then replaced with one that accommodates the entered timing information. In the preferred embodiment, the user is asked to verify the new classification prior to its inclusion in the specification file. Classifications associated with a User Declared value of 1 are those for which deviations from expected timing characteristics are not uncommon.

The parsing operation can be illustrated by returning to the earlier example, "Setup time, B high to clock A low". The first (i.e. least ambiguous) matching lexicon entries are:

set*up*.class;setup

^.signal;true [match to "B"]

high.state;1 to.to;to clock*.is;clock

^.signal;true [match to "A"]

low.state;0

Using the parsing method discussed above, the match to *set*up*.class;setup* determines the classification of the specification as a setup time. The first match to "B" and subsequent match to "high" result in the From Signal category relating to this specification being set to "1". The match to "to" indicates that the following signal entry will set the To Signal dependence category. That signal is represented by the matches to "A" and subsequently to "low", which result in the To Signal category relating to this specification being set to "0". Had the user worded the entry as "clock A low after B high", the same result would be achieved due to the match to *after.to;from,* which causes entries that were tentatively placed in the From Signal category (first signal to occur) to be transferred to the To Signal category (last signal to occur), with subsequent entries directed to the From Signal category. In other words, the "normal" order of specification is the From Signal first and To Signal last. The *after.to;from* entry indicates that the order is reversed and the system responds accordingly.

The lexicon matches also provide sufficient information to choose a specification name according to JEDEC Standard 100. This is accomplished using straightforward table lookup procedures. For this example, the specification name would be "TBHAL".

After parsing, the specification file would be as follows:

| Symbol | Description | Min | Max | Typ |
|--------|-------------|-----|-----|-----|
| TBHAL | Setup Time, B high to Clock A Low | 10 | — | — |

A specification database entry is also created for the entered specification, as follows:

| From Prev. | From Current | To Prev. | To Current | Same Signals | Diff Signals | Type | Classif. |
|------------|--------------|----------|------------|--------------|--------------|------|----------|
| | 1 | | 0 | 0 | 1 | Min | Setup |

This organized set of data can be combined with numerous similar sets for further analysis (e.g., to derive dependence information in accordance with the inventions disclosed in the '624 and '811 applications).

The terms and expressions which have been employed are used as terms of description and not of limitation, and there is no intention, in the use of such terms and expressions, of excluding any equivalents of the features shown and described or portions thereof, but it is recognized that various modifications are possible within the scope of the invention claimed.

I claim:

1. A method of reducing an unstructured electronic timing specification to a consistent format, comprising the steps of:
   a. storing the unstructured specification as a character string;
   b. performing sequential, character-by-character matching analysis between the character string and a set of lexicon entries having varying degrees of ambiguity, a match between an entry and the character string indicating whether the character string contains information representative of one or more classifications;
   c. selecting the least ambiguous matches between the lexicon entries and the character string; and
   d. based on the matching analysis, generating a symbolic description of the specification according to a known standard.

2. The method of claim 1 wherein the lexicon entries further indicate whether the character string contains information representative of one or more signals, and whether the signal is asserted true or false or is a data signal.

3. The method of claim 1 wherein the lexicon entries further indicate whether the character string contains information representative of one or more states.

4. The method of claim 1 wherein the lexicon entries further indicate whether the character string contains information representative of a clock signal.

5. The method of claim 1 further comprising the step of generating a default classification if no match is found.

6. A method of reducing to a consistent format an unstructured electronic timing specification containing information representative of at least one classification and at least one signal, comprising the steps of:
   a. storing the unstructured specification as a character string;
   b. performing sequential, character-by-character matching analysis between the character string and a set of lexicon entries sorted in order of increasing ambiguity until the least ambiguous match or matches are found, a match between an entry and the character string indicating that the character string contains information representative of one or more classifications;
   c. based on the classification information derived from the matching analysis, generating a tentative symbolic description of the specification according to a known standard; and
   d. verifying that the signal information is consistent with the classification information.

7. The method of claim 6 further comprising the step of modifying the symbolic description if the signal information is inconsistent with the classification information.

8. An apparatus for reducing an unstructured electronic timing specification to a consistent format, comprising:
   a. operator-responsive input means for receiving an unstructured timing specification;
   b. means, operatively coupled to the input means, for receiving therefrom the unstructured specification and storing the same as a character string; and
   c. processor means for:
      1) retrieving the character string;
      2) performing sequential, character-by-character matching analysis between the character string and a stored set of lexicon entries having varying degrees of ambiguity, a match between a lexicon entry and the character string indicating that the character string contains information representative of one or more classifications;
      3) selecting the least ambiguous match or matches between the lexicon entries and the character string;
      4) based on the classification information derived from the matching analysis, generating a symbolic description of the specification according to a known standard; and
      5) storing the symbolic description.

9. The apparatus of claim 8 further comprising output means for communicating the stored symbolic symbolic description.

10. The apparatus of claim 8 wherein the lexicon entries further indicate whether the character string contains information representative of one or more signals, and whether the signal is asserted true or false or is a data signal.

11. The apparatus of claim 10 wherein the lexicon entries further indicate whether the character string contains information representative of one or more states.

12. The apparatus of claim 8 wherein the lexicon entries further indicate whether the character string contains information representative of a clock signal.

13. The apparatus of claim 8 wherein the processor means is further adapted to generate and store a default classification if no match is found.

14. An apparatus for reducing to a consistent format an unstructured electronic timing specification containing information representative of at least one classification and at least one signal, the apparatus comprising:
   a. operator-responsive input means for receiving an unstructured timing specification;
   b. means for storing:
      1) the unstructured specification as a character string;
      2) a set of lexicon entries sorted in order of increasing ambiguity, each entry being indicative of one or more classifications and also corresponding to a symbolic description; and
      3) information representative of the signal characteristics associated with the one or more classifications;
   c. means, operatively coupled to the input means, for receiving therefrom the unstructured specification and storing the same in the storage means; and
   d. processor means, operatively coupled to the storage means, for:
      1) performing sequential, character-by-character matching analysis between the stored character string and the stored set of lexicon entries until the least ambiguous match or matches therebetween is found;
      2) based on the matching analysis, associating the specification with the symbolic description corresponding to each matched lexicon entry, and storing the tentative description; and
      3) comparing the signal characteristics associated with the classification corresponding to each matched entry with the stored signal characteristics from the specification.

15. The apparatus of claim 14 further comprising means for modifying the symbolic description if the compared characteristics are not identical.

16. The apparatus of claim 14 further comprising means for checking said lexicon entries for conflicting ambiguities.

* * * * *